United States Patent [19]

Noyama et al.

[11] Patent Number: 5,235,164
[45] Date of Patent: Aug. 10, 1993

[54] PARTS SUPPLY DEVICE, PARTS SUPPLY METHOD, PARTS MANAGING SYSTEM, AND PARTS MANAGING APPARATUS

[75] Inventors: Takashi Noyama, Suita; Yoshifumi Nakao, Nara; Masanori Yasutake, Hirakata; Satoshi Tanaka, Higashiosaka; Shinji Morimoto, Neyagawa; Noriaki Yoshida, Ikeda, all of Japan

[73] Assignee: Matsushita Electric Industrial Co., Ltd., Osaka, Japan

[21] Appl. No.: 760,353

[22] Filed: Sep. 16, 1991

[30] Foreign Application Priority Data

Sep. 19, 1990 [JP] Japan .................................. 2-250908
Oct. 29, 1990 [JP] Japan .................................. 2-292337

[51] Int. Cl.⁵ .......................................... H05K 13/00
[52] U.S. Cl. .................................... 235/375; 29/701; 29/729; 364/478
[58] Field of Search .................. 235/375; 29/720, 701, 29/709, 729, 430; 364/478

[56] References Cited

U.S. PATENT DOCUMENTS

| | | | |
|---|---|---|---|
| 4,610,083 | 9/1986 | Campisi et al. | 29/832 |
| 4,787,143 | 11/1988 | Yagi et al. | 29/710 |
| 4,815,190 | 3/1989 | Haba, Jr. et al. | 29/784 |
| 4,872,257 | 10/1989 | Wakamori et al. | 29/720 |
| 4,884,330 | 12/1989 | Sticht | 29/784 |
| 4,894,908 | 1/1990 | Haba, Jr. et al. | 29/711 |
| 5,036,582 | 8/1991 | Usui | 29/714 |
| 5,090,113 | 2/1992 | Umetsu et al. | 29/709 |

FOREIGN PATENT DOCUMENTS

3704414A1 8/1988 Fed. Rep. of Germany .
3-120897 5/1991 Japan .
3-268492 11/1991 Japan .

Primary Examiner—Carolyn E. Fields
Assistant Examiner—Drew A. Dunn
Attorney, Agent, or Firm—Wenderoth, Lind & Ponack

[57] ABSTRACT

A parts supply device includes a mounting device for mounting a unit accommodating electronic parts on a parts mounting machine, a parts feeding device for sequentially feeding the parts held by the unit to a predetermined removing position according to an operation of the machine for removing the parts from the parts supply device, a storing device for storing data as to the number of parts held by the unit, and a calculating device for rewriting the parts number data stored in the storing device according to the operation of the machine for removing the parts from the supply device. A parts supply method includes the steps of reading an identifying mark of the unit and fetching the parts number data of the unit from a data base in a storage area, based on data as to the kind of parts, writing each piece of data obtained above in a storing unit of the supply device, and rewriting the parts number data written in the storing unit according to operation of the machine for removing the parts from the supply device. In a parts managing system, after it is decided whether or not the mark corresponds to the parts identification data, the parts number data is stored in the storing unit in the parts supply device according to decision that the mark corresponds to the identification data, a current number of parts is read in the data base in removing the unit from the supply device and stored in the data base.

32 Claims, 9 Drawing Sheets

Fig. 8

| Z POSITION | PARTS NAME | CONDITION |
|---|---|---|
| 1 | ............ | OK |
| 2 | ............ | OK |
| 3 | ............ | NG |
| ⋮ | ⋮ | ⋮ |

Fig. 9

| Z POSITION | PARTS NAME | ADVANCE NOTICE OF PARTS SHORTAGE (min) 60  120  180 |
|---|---|---|
| 14 | ......... | ▬ |
| 70 | ......... | ▬▬ |
| 2 | ......... | ▬▬▬▬ |
| 30 | ......... | ▬▬▬▬▬▬ |
| 47 | ......... | ▬▬▬▬▬▬▬ |
| ⋮ | ⋮ | |

PARTS SUPPLY DEVICE, PARTS SUPPLY METHOD, PARTS MANAGING SYSTEM, AND PARTS MANAGING APPARATUS

BACKGROUND OF THE INVENTION

The present invention relates to a parts supply device for supplying electronic parts to an electronic parts mounting machine, a method for supplying the electronic parts to the parts mounting machine, and a system and an apparatus for managing the electronic parts in supplying them to the parts mounting machine.

Conventionally, a unit accommodating a plurality of electronic parts, for example, a unit which is composed of electronic parts attached onto a carrier tape and covered with a cover tape, the tapes and the parts being wound around a reel, is mounted on a parts supply device set on the parts mounting machine. Electronic parts are sequentially fed from the parts supply device to a predetermined removing position according to a parts mounting operation of the parts mounting machine.

If all or some of the electronic parts of the unit held by the parts supply device are supplied to the parts mounting machine and the parts are suddenly exhausted, the parts mounting operation is suspended until a different parts supply device is set on the parts mounting machine. Thus, the operating efficiency of the parts mounting machine is reduced. In order to operate the parts mounting machine without a suspension, the initial number of parts held by the parts supply device is manually inputted to the parts mounting machine so that the number of parts is rewritten by the writing means of the parts mounting machine according to a parts mounting operation of the parts mounting machine.

However, in view of the fact that tens to hundreds of parts supply devices are set on the parts mounting machine in recent years, the conventional construction necessitates much time and labor to be spent in inputting the data of the initial number of each kind of parts. Further, an erroneous data input may occur.

It is possible to provide the parts supply device with a storing section for storing the initial number of parts so that the initial number is read by the reading means of the parts mounting machine. But the number of parts stored in the storing section cannot be rewritten by the construction where only a storing section is provided, so that the number of parts is unknown when the parts supply device is set on the parts mounting machine again.

It is also possible that the parts mounting machine has a function for rewriting the number of parts according to each parts mounting operation. In this case, the part mounting device is required to communicate with each parts supply device set thereon so as to rewrite the number of parts. Since it takes a considerable length of time to perform communications, it is difficult to reduce the parts mounting operation.

In addition, conventionally, in a parts managing section which stores units each accommodating several kinds of electronic parts, the data of each unit is manually inputted to the data base each time they are set into the parts managing section. In addition, each time a unit mounted on the parts supply device is transported from the parts managing section or some parts which remain unused are returned to the parts managing section after a series of mounting operations terminates, the data thereof are also manually inputted to the data base.

If electronic parts are exhausted suddenly with the parts supply device set on the parts mounting machine, the parts mounting operation is suspended. Thus, the operating efficiency of the parts mounting machine is reduced. According to the conventional art for operating the parts mounting machine without suspension, the initial number of parts mounted on each parts supply device is manually inputted to the control device of the parts mounting machine and data is rewritten every time that one of the parts is mounted on the parts mounting machine. When a series of parts mounting operations terminates, the number of parts of each kind which remain unused is outputted from the control device. Based on the data obtained by the output, the data of the number of parts which are to be returned to the parts managing section is manually inputted to the control device in setting the parts supply device on the parts mounting machine again.

As described above, the conventional construction requires much time and labor and in addition, an erroneous data input or an input omission may occur. As a result, a difference may arise as to the number of parts indicated by the data and the actual number of parts.

Further, a manual input of data to the control device of the parts mounting machine leads to the spending of much time and labor and may result in an erroneous data input. In order to solve this disadvantage, a storing section is provided in the parts supply device so that the storing section stores the initial number of parts and the control device reads the data stored in the storing section when the parts supply device is set on the parts mounting machine. But when the parts supply device is removed from the parts mounting machine, a disadvantage similar to the above-described one occurs. It is possible for the control device to rewrite the content stored in the storing section of the parts supply device. But it takes much time for the control device and the storing section to perform communications with each other. Thus, it is difficult to reduce the parts mounting operation.

SUMMARY OF THE INVENTION

Accordingly, an object of the present invention is to provide a parts supply device and a parts supply method both capable of holding the current number of parts when the parts supply device is removed from a parts mounting machine, preventing the operation of the parts mounting machine from stopping due to the shortage of parts even when the parts supply device is set again on the parts mounting machine, and rewriting the data of the number of parts.

Another object of the present invention is to provide a system and an apparatus for managing a unit accommodating parts in supplying the unit to the parts mounting machine capable of accurately and easily managing the unit when the number of parts held by the unit becomes less than a predetermined number and when they are set into a parts managing section or removed therefrom so that the parts are mounted on the parts mounting machine.

In accomplishing the first object of the present invention, there is provided a parts supply device comprising:
a mounting means for mounting a unit accommodating a plurality of electronic parts on a parts mounting machine;

a parts feeding means for sequentially feeding the parts held by the unit to a predetermined removing position according to an operation of the parts mounting machine for removing the parts from the parts supply device;

a storing means for storing data as to the number of parts held by the unit; and a calculating means for rewriting the data as to the number of parts stored in the storing means according to the operation of the parts mounting machine for removing the parts from the parts supply device.

In accomplishing the first object of the present invention, there is provided a method for managing a number of parts in supplying the parts comprising the steps of:

reading an identifying mark provided on a unit accommodating a plurality of electronic parts and fetching data as to the number of the parts of the unit from a data base in a storage area, based on data as to the kind of parts;

writing each piece of data obtained in the reading step in a storing means of a parts supply device on which the unit is mounted; and rewriting the data as to the number of parts written in the storing means according to an operation of a parts mounting machine for removing the parts from the parts supply device.

According to the above-described construction, since the storing means stores data of an initial number of parts held by the unit and the calculating means rewrites the data as to number of the parts according to the operation of the parts mounting machine, the store means can store a current number of the parts held by the unit. Therefore, it is possible to appropriately exchange the unit in which the parts are exhausted for another unit. Furthermore, the data as to the number of parts of the unit can be rewritten without a data transmission between the parts supply device and the parts mounting machine. Accordingly, even when a plurality of parts supply devices are set on the parts mounting machine, the setting operation of the parts supply devices to the parts mounting machine does not prevent the parts mounting process from being stopped.

In accomplishing the second object of the present invention, there is provided a system for managing a unit in supplying the unit to a parts mounting machine in which the unit, which accomodates a plurality of electronic parts, is mounted on a parts supply device, the system comprising the steps of:

reading an identifying mark provided on the unit and indicating an identification data of the parts;

reading out the identification data and data as to the number of the parts stored in a data base of a storage area;

deciding whether or not the identifying mark corresponds to the identification data and the data as to the number of parts;

storing the data as to the number of parts in a storing means provided in the parts supply device according to a decision that the identifying mark corresponds to the identification data of the parts;

reading a current number of the parts held by the unit in the data base in removing the unit from the parts supply device; and storing the current number in the data base.

According to the above system, in transporting the parts from a parts storing place to the parts mounting machine, the unit accommodating the parts is mounted on the parts supply device, the identifying mark of the unit is read, and the identification data and the data as to the number of parts which remain unused in the unit is read out from the data base, and it is decided whether or not the identifying mark provided on the parts supply unit corresponds to the identification data of the parts read out from the data base, and when the mark corresponds to the identification data, the data as to the number of parts are stored in the storing means of the parts supply device, and then the parts supply device is set on the parts mounting machine. Thereafter, if necessary, the content stored in the storing means may be rewritten each time the parts are supplied to the parts mounting machine. In returning the parts to the parts storing place, the current number of the parts held by the unit is read and stored in the data base. When the number of parts of the unit becomes less than a predetermined number, the unit is removed from the parts supply device. Thus, the unit can be managed easily and accurately.

In accomplishing the second object of the present invention, there is provided an apparatus for managing a unit in supplying the unit to a parts mounting machine in which the unit, which accommodates a plurality of electronic parts, is mounted on a parts device, the apparatus comprising:

a first reading means for reading an identifying mark provided on the unit and indicating an identification data of the parts;

a read-out means for reading out the identification data and data as to the number of parts stored in a data base of a storage area;

a first decision means for deciding whether or not the identifying mark corresponds to the identification data of the parts;

a first storage means for storing the data as to the number of parts, provided in the parts supply device according to a decision that the identifying mark corresponds to the identification data of the parts;

a second read means for reading a current number of the parts held by the unit in the data base in removing the unit from the parts supply device; and a second storage means for storing the current number in the data base.

According to the above apparatus, in transporting the parts from a parts storing place to the parts mounting machine, the unit accommodating the parts is mounted on the parts supply device, the identifying mark of the unit is reading by the read means, and the identification data and the data as to the number of parts which remain unused in the unit is read out from the data base by the read-out means, and it is decided whether or not the identifying mark provided on the parts supply unit corresponds to the identification data of the parts read out from the data base by the decision means, and when it is decided by the decision means that the mark corresponds to the identification data, the data as to the number of parts are stored in the storing means of the parts supply device by the read and storage means, and then the parts supply device is set on the parts mounting machine. Thereafter, if necessary, the content stored in the storing means may be rewritten each time the parts are supplied to the parts mounting machine by the read and storage means. In returning the parts to the parts storing place, the current number of parts held by the unit is read and stored in the data base. When the number of parts of the unit becomes less than a predetermined number, the unit is removed from the parts supply device. Thus, the unit can be managed easily and accurately.

BRIEF DESCRIPTION OF THE DRAWINGS

Before the description of the present invention proceeds, it is to be noted that like parts are designated by like reference numerals throughout the accompanying drawings, in which:

FIG. 8 is a view displaying a result obtained by a decision as to whether or not a parts supply device according to the embodiment has been set in position;

FIG. 9 is a view displaying a result obtained by a decision as to advance notice of parts according to the embodiment;

DETAILED DESCRIPTION OF THE INVENTION

Figure 1:
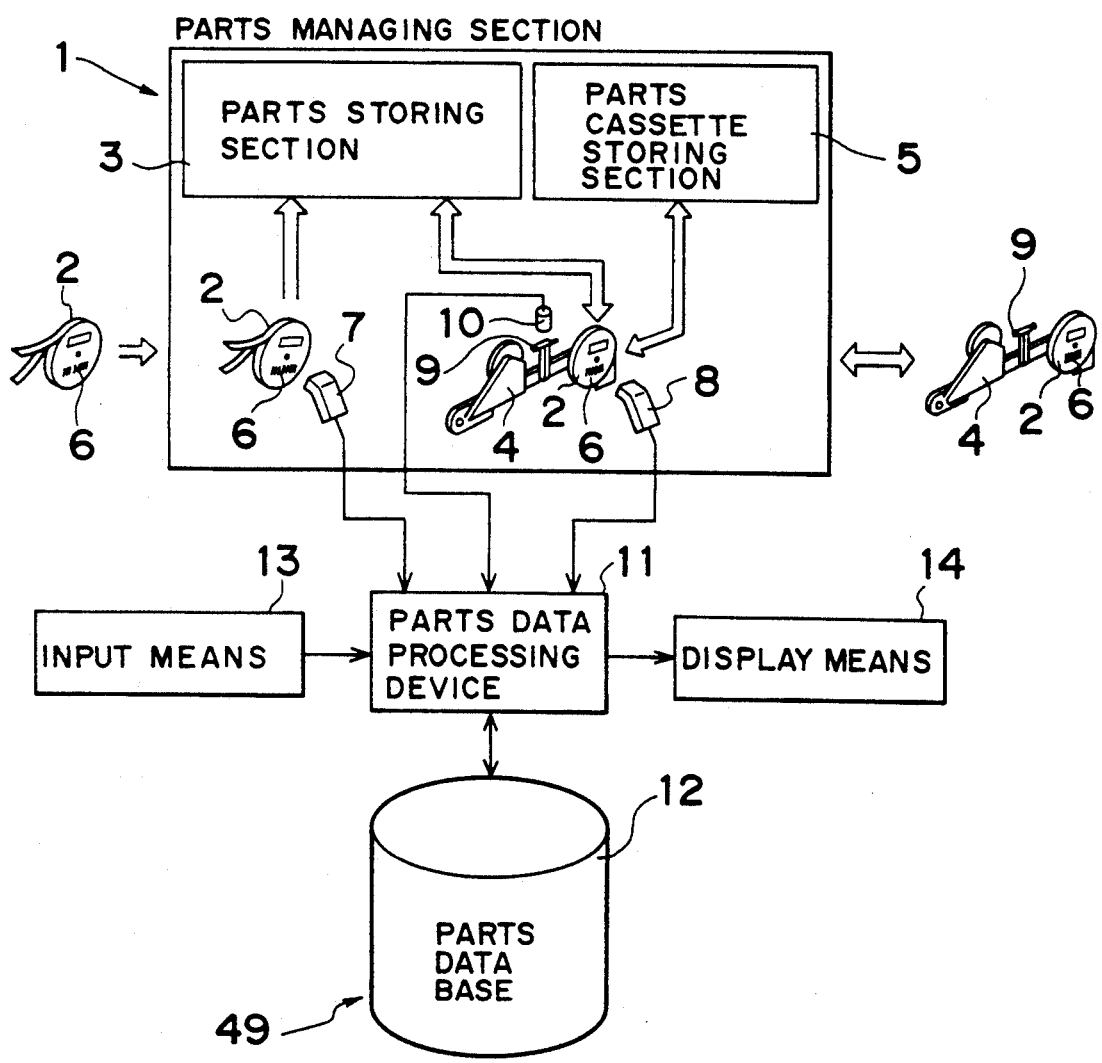
FIG. 1 is a construction view showing a parts managing section according to an embodiment of the present invention.

Referring to the accompanying drawings, an embodiment of the present invention is described below.

A parts managing section 1 includes a parts storing section 3; a parts cassette 4 serving as a parts supply device; and a parts cassette storing section 5. An electronic parts-accommodating unit 2 composed of electronic parts removably attached onto a cover tape and covered the parts with a carrier tape, the tapes and the parts being wound around a reel, is transported into the parts managing section 1 and stored in the parts storing section 3. The unit 2 is then mounted on the parts cassette 4. The parts cassette 4 is set on the supply section of an electronic parts mounting machine 40 with the unit 2 mounted on the parts cassette 4 so that parts of the unit 2 are sequentially fed to a parts removing position. The unit 2 has a bar code 6 displaying an identification data of the parts, such as the serial number for identification, and name and initial quantity of each of the parts printed thereon. The parts managing section 1 further includes a first bar code reader 7 for reading the bar code 6 when the unit 2 has been set thereinto; a second bar code reader 8 for reading the bar code 6 when the unit 2 is mounted on the parts cassette 4 or removed therefrom; and a reading/writing means 10 for reading data written on a recording section 9 provided on the parts cassette 4 and writing data on the recording section 9. The bar code readers 7 and 8 and the reading/writing means 10 are connected to a parts data processing device 11. The parts data processing device 11 is connected to a parts data base 12 for storing the data of the parts mounted on the unit 2 held by the parts managing section 1. The parts data processing device 11 is also connected with an inputting means 13 and a display means 14. The inputting means 13 outputs data or an instruction for reading or processing the data stored in the data base 12 to the parts data processing device 11. The display means 14 displays the result of the data processing executed by the parts data processing device 11.

Figure 2:
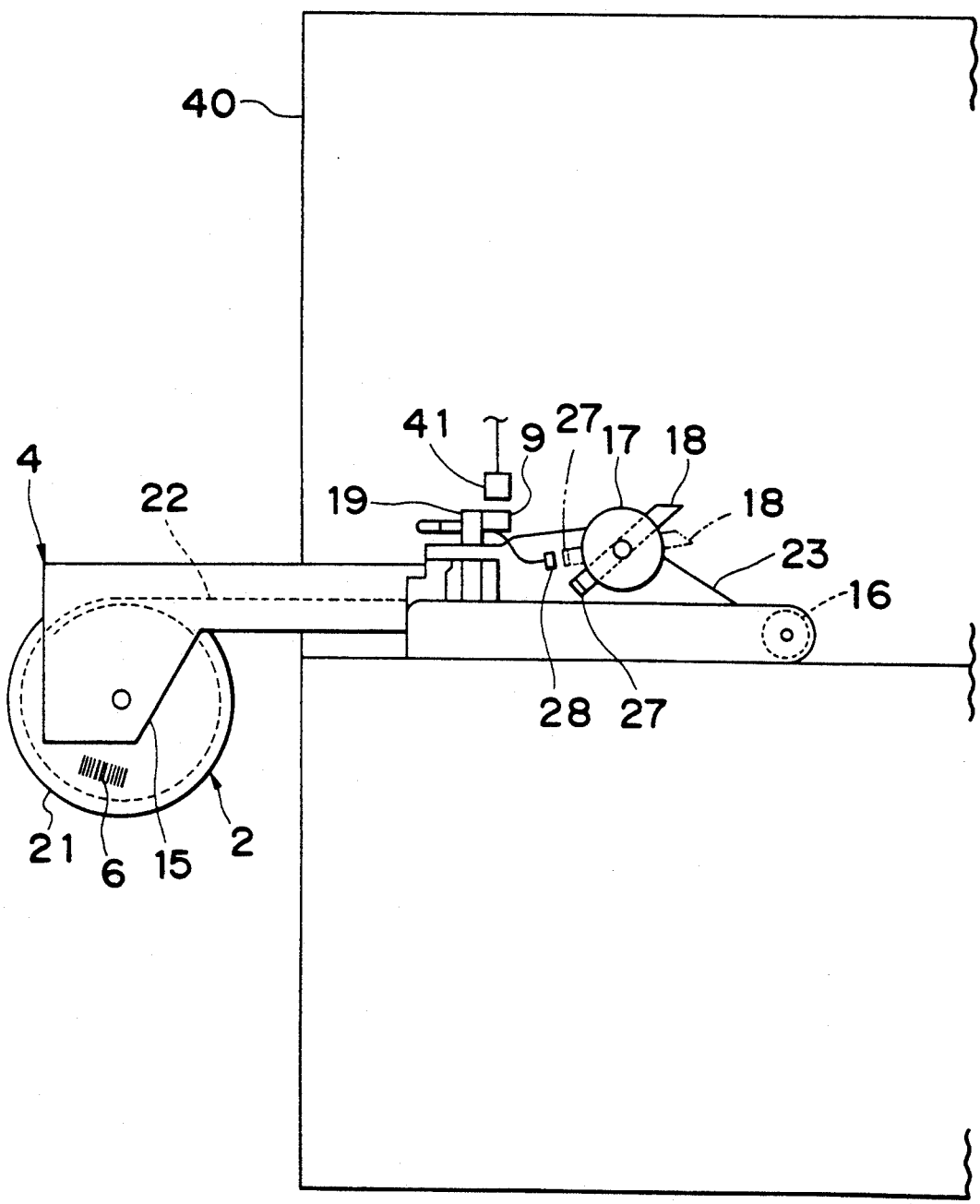
FIG. 2 is a side elevation showing the condition in which a parts supply device according to the embodiment is set on a parts mounting machine.

FIG. 2 is a side elevation showing the condition in which the parts cassette serving as the parts supply device has been set on the parts mounting machine 40 according to the embodiment. The parts cassette 4 includes a reel mounting section 15, provided in the rear portion thereof, for rotatably mounting a reel 21 of the unit 2 thereon; a feeding section 16, provided in the front end thereof, for intermittently feeding a carrier tape 22 of the unit 2 so as to sequentially move each of the parts to the parts removing position; a winding section 17 for winding a cover tape 23 of the unit 2; and a pivotal lever 18 for driving the feeding section 16. The winding section 17 and the lever 18 are each positioned at a rear portion of the feeding section 16. The parts cassette 4 further includes a locking section 19 for setting the parts cassette 4 on the parts mounting machine 40. The above-described recording section 9 is provided in the locking section 19.

Figure 3:
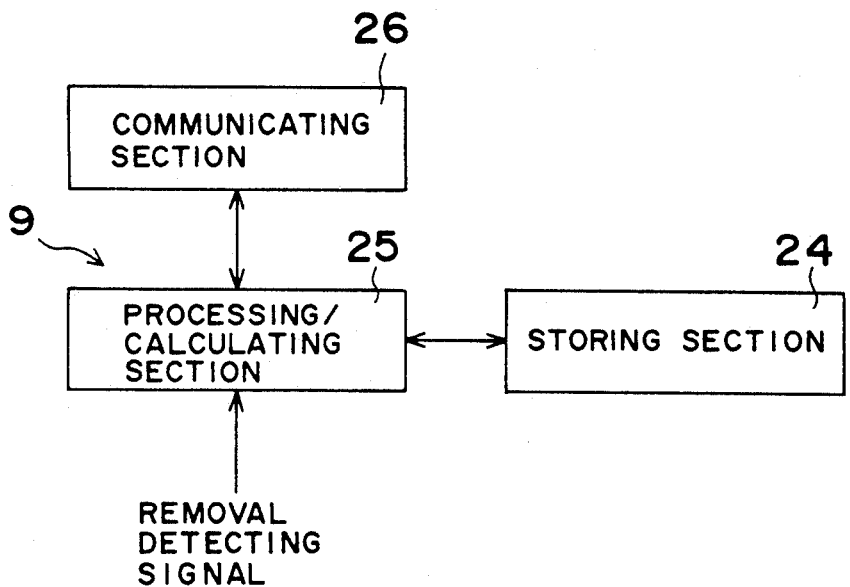
FIG. 3 is a block diagram showing the recording section according to the embodiment.

FIG. 3 is a block diagram of the recording section of the parts cassette 4 serving as the parts supply device according to the embodiment. The recording section 9 composed of an IC memory includes a storing section 24 for storing the data of the name and quantity of each of the parts held by the unit 2, the data being read and written by a processing/calculating section 25; the processing/calculating section 25 for subtracting "1" from the initial quantity of the parts stored in the storing section 24 each time one of the parts is taken out from the unit 2, according to a signal inputted thereto from a removal detecting member 28 which will be described later, thus writing a value found by the subtraction on the storing section 24; and a communicating section 26 for sending the data stored in the storing section 24 to the reading/writing means 10 of the parts managing section 1 and a communicating section 41 of the parts mounting machine 40 and receiving a signal therefrom via the processing/calculating section 25. The removal detecting member 28 for outputting a signal upon detection of magnetic force is provided at a position in the vicinity of the termination of the moving locus of a permanent magnet 27 mounted on an end of the lever 18 as shown in FIG. 2. The removal detecting member 28 outputs a signal each time parts is removed from the unit 2.

Figure 4:
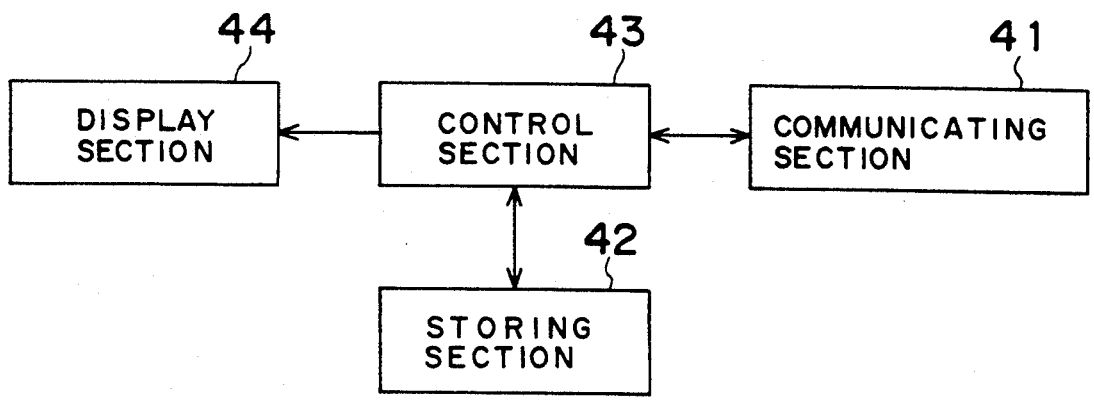
FIG. 4 is a block diagram showing the control device of the parts mounting machine according to the embodiment.

FIG. 4 is a block diagram of the control device of the parts mounting machine 40 according to the embodiment.

A storing section 42 stores the data of the program as to the type of each machine to be manufactured, the name and quantity of each part to be mounted thereon, the data as to the position at which each parts cassette 4 is set, and the data as to the period of time required for mounting the necessary parts on one substrate. A control section 43 controls the operation of the parts mounting machine 40 based on the program; decides whether or not the parts cassette 4 is set in position; decides the order of parts shortage among the parts cassette 4; and sends data to the communicating section 41 and a display section 44 and receives data therefrom. The display section 44 displays the result decided by the control section 43.

Figure 5:
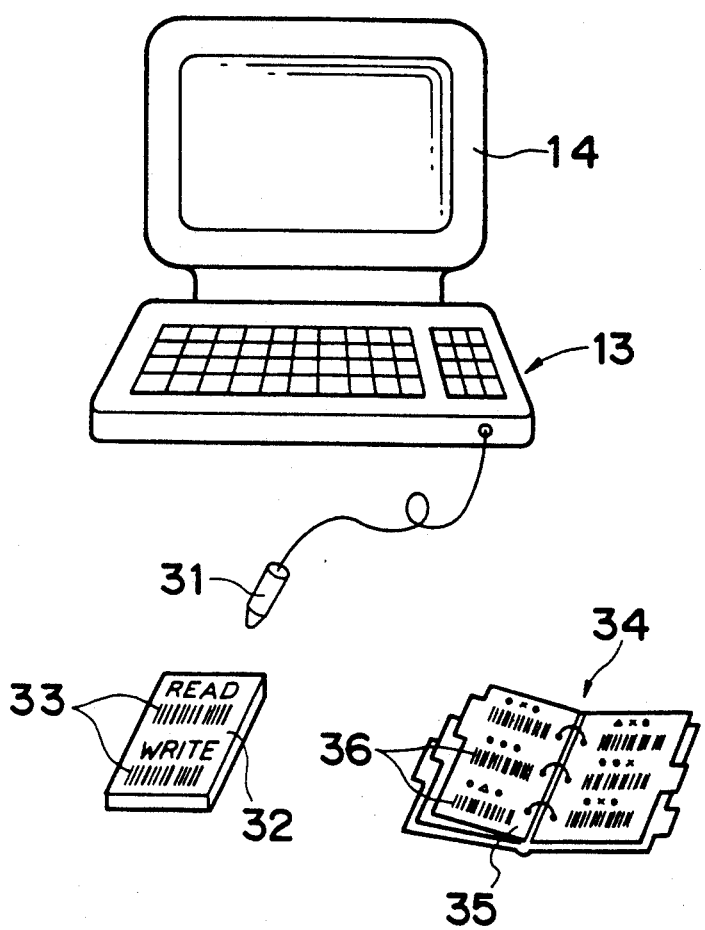
FIG. 5 is a perspective view showing an inputting means for inputting data to the parts data processing device of the parts managing section according to the embodiment.

The inputting means 13 connected with the parts data processing device 11 of the parts managing section 1 is provided with a bar code reader 31 as shown in FIG. 5. The inputting means 13 is further provided with an instruction code plate 32 on which a bar code 33 corresponding to each instruction to be transmitted to the parts data processing device 11 has been written and a parts code book 34 in which a plurality of parts code sheets 35 are bound for each kind of machine to be manufactured. A bar code 36 corresponding to each of the parts necessary for each kind of machine is written on the parts code sheets 35. Owing to this construction, the reading of the stock data of each of the parts necessary for each kind of device and various processings can be accomplished by only the operation of the bar code reader 31, which eliminates data input operation by means of keys.

Figure 6:
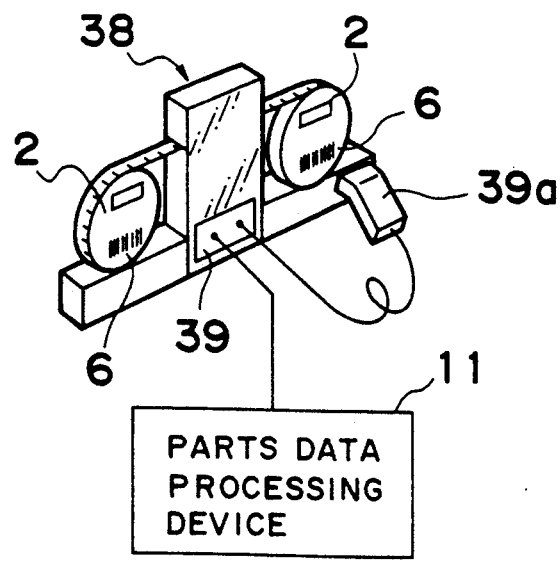
FIG. 6 is a perspective view showing a combining device, for combining parts-accommodated units, provided in the managing section according to the embodiment.

As shown in FIG. 6, the parts managing section 1 includes a parts combining device 38 for combining the units 2 holding parts, the number of which is less than a predetermined number. The combining device 38 is provided with a signal outputting means 39 for outputting a signal indicating the data of units 2 to be combined to the parts data processing device 11. The outputting means 39 is connected with a bar code reader 39a for reading the bar code 6 of the units 2 to be combined. Based on the signal outputted from the outputting means 39, the parts data processing device 11 erases the data of the units 2 to be combined before the combination and automatically stores the data of the combined units 2 after the combination.

In the above-described construction, when the unit 2 is transported into the parts managing section 1 and held by the parts storing section 3, the bar code 6 of the unit 2 is read by the bar code reader 7 and the data thus read is stored in the data base 12 of a storage 49 via the parts data processing device 11. Each unit 2 is held by the parts storing section 3 at a predetermined position thereof. The position at which the unit 2 has been accommodated may be displayed by the display means 14.

Figure 7:
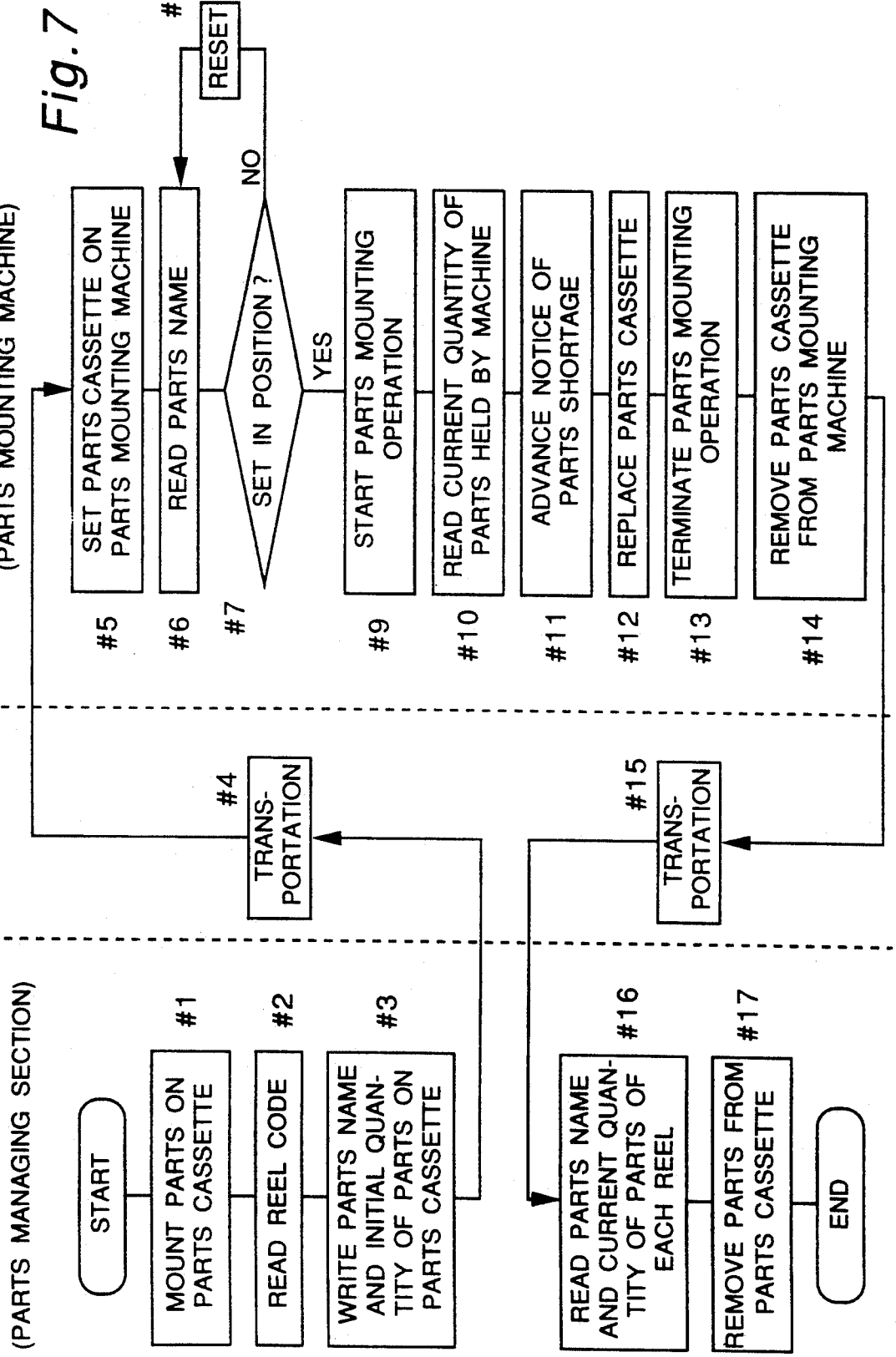
FIG. 7 is a flowchart for managing parts when they are supplied to the parts mounting machine according to the embodiment.

The flow of the parts management in supplying parts on the parts mounting machine 40 is described with reference to the flowchart shown in FIG. 7.

Based on the kind of a machine to be manufactured, the unit 2 is mounted on the parts cassette 4 at step #1. When the bar code reader 8 reads the bar code 6 at step #2, the data of the name and quantity of each of the parts of the unit 2 are fetched from the data base 12, and at step #3, the reading/writing means 10 writes the data on the storing section 24 of the recording section 9 of the parts cassette 4.

At step #4, the parts cassette 4 is transported to the parts mounting machine 40. At step #5, the parts cassette 4 is set on a predetermined position of the parts supply section of the parts mounting machine 40. When all parts cassettes 4 have been set on the parts mounting machine 40, an instruction for checking whether or not all parts cassettes 4 have been set on the parts mounting machine 40 is inputted to the parts mounting machine 40. Based on a program stored to the storing section 42 as a result of the input of the signal, the control section 43 of the parts mounting machine 40 reads each parts name from the storing section 24 of each parts cassette 4 at step #6 and decides whether or not each parts cassette is set at the predetermined position at step #7, thus displaying the result obtained by the decision of the control section 43 on the display section 44 as shown in FIG. 8. If any parts cassette have not been set at the predetermined position and then they are displayed as "NG" on the display section 44, they are set again at step #8. Then, the program returns to step #6. If all parts cassette have been set in position and thus they are displayed as "OK" on the display section 44, the program goes to step #9 at which an operation for mounting parts held on the parts mounting machine 40 on a substrate starts.

During the parts mounting operation, the lever 18 pivots every time each of the parts is taken out from the unit 2. As a result, the removal detecting member 28 outputs a signal and consequently, the processing/calculating, section 25 subtracts "1" from the data as to the number of parts of the parts cassette stored in the storing section 24, thus rewriting the data of the storing section 24. In order to check for a parts shortage of the parts cassette during the parts mounting operation, an instruction indicating the advance notice of the parts shortage is inputted to the communicating section 41 of the parts mounting machine 40. Then, at step #10, the control section 43 reads the current number of parts held by each parts cassette 4 and calculates the period of time required for mounting all of parts to be mounted which are held by the parts cassette, based on the number of parts to be mounted on one substrate and the period of time required for mounting parts thereon, thus displaying the data obtained by the calculation on the display section 44 at step #11 as shown in FIG. 9. The parts cassette 4 is exchanged with an appropriate parts cassette 4 at step #12, as required. As a result, the order of parts shortage among the parts cassette 4 is decided by the control section 43 of the parts mounting machine 40 and in the order, the parts cassette 4 lacking the parts is exchanged for a new parts cassette 4. Therefore, the parts mounting machine 40 can be operated without stopping it, thus preventing reduction of the operating efficiency of the parts mounting machine 40.

When the parts mounting operation terminates at step #13, the parts cassettes 4 are removed from the parts supply section of the parts mounting machine 40 at step #14 and transported to the parts managing section 1 at step #15. At step #16, in the parts managing section 1, the bar code reader 8 reads the bar code 6 of the unit 2, the reading/writing means 10 reads the name and number of each of the parts stored in the storing section 24 of the recording section 9 of the parts cassette 4, and the data of each of the parts thus read and the current remaining serial number of the unit 2 are stored in the data base 12. Then, at step #17, the unit 2 is removed from the parts cassette 4 and held by the parts storing section 3.

As described above, the parts cassette 4 rewrites the current number of parts of the unit 2 mounted thereon. Therefore, unlike the conventional art in which the parts mounting machine 40 rewrites data onto the parts cassette 4, the period of time required for the communication between the parts mounting machine 40 and the parts cassette 4 is short, and thus it is possible to reduce the time required for mounting the parts cassette 4 on the parts mounting machine 40.

In addition, the current number of parts held by the unit 2 and the serial number thereof are controlled. Therefore, when the unit 2 is removed from the parts cassette 4 after the parts mounting operation and then mounted on a different parts cassette 4, the current parts number of the parts cassette held by the unit 2 can be written on the recording section 9 of the parts cassette 4. Thus, the parts cassette 4 can be effectively used. No manual input of data is necessary both in the mounting of the unit 2 on the parts cassette 4 and the removal of the unit 2 therefrom. Thus, parts can be easily managed and an erroneous data input or the omission of a data input does not occur.

The provision of the bar code reader 31, the instruction code plate 32, and the parts code book 34 as shown in FIG. 5 serving as the inputting means 13 facilitate an operation for inputting an instruction or data to the processing device 11 and prevents an erroneous data input in accessing the data base 12. Further, the operation for inputting the data of parts management can be easily performed by using the combining device 38 as shown in FIG. 6.

Figure 10:
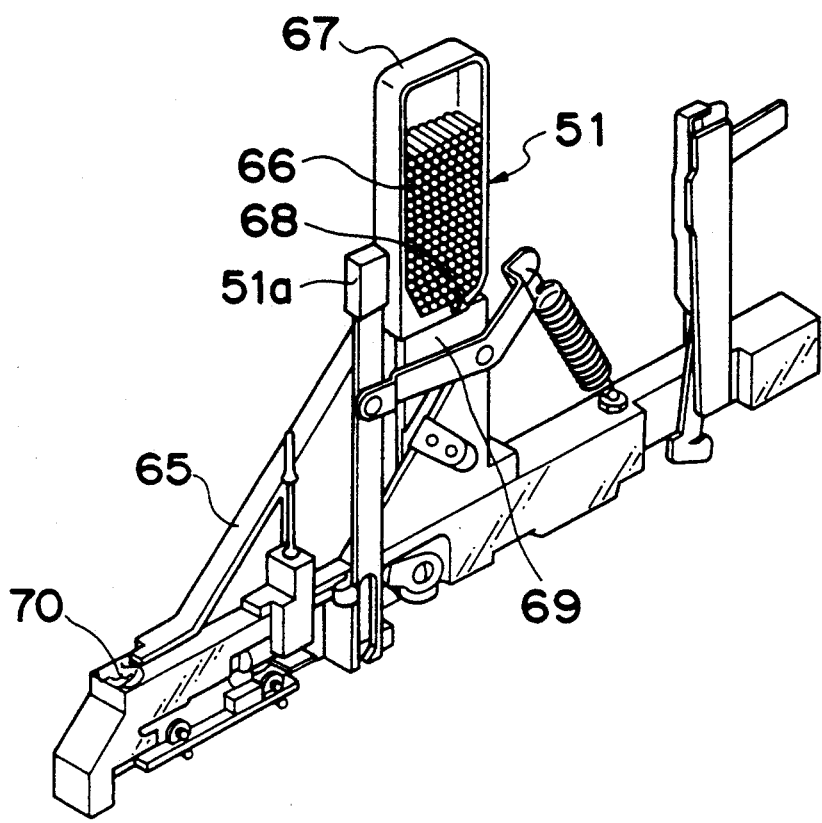
FIGS. 10, 11, and 12 are perspective views showing parts-accommodated unit according to another embodiment of the present invention.
Figure 12:
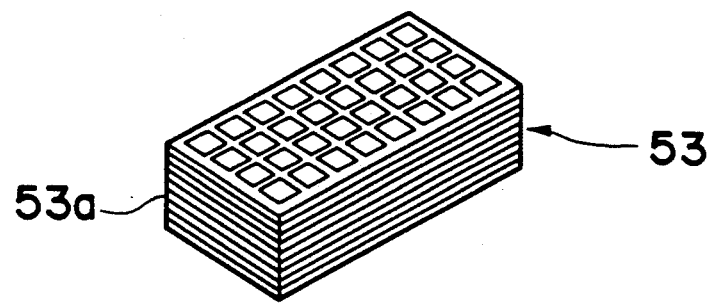
Figure 11:
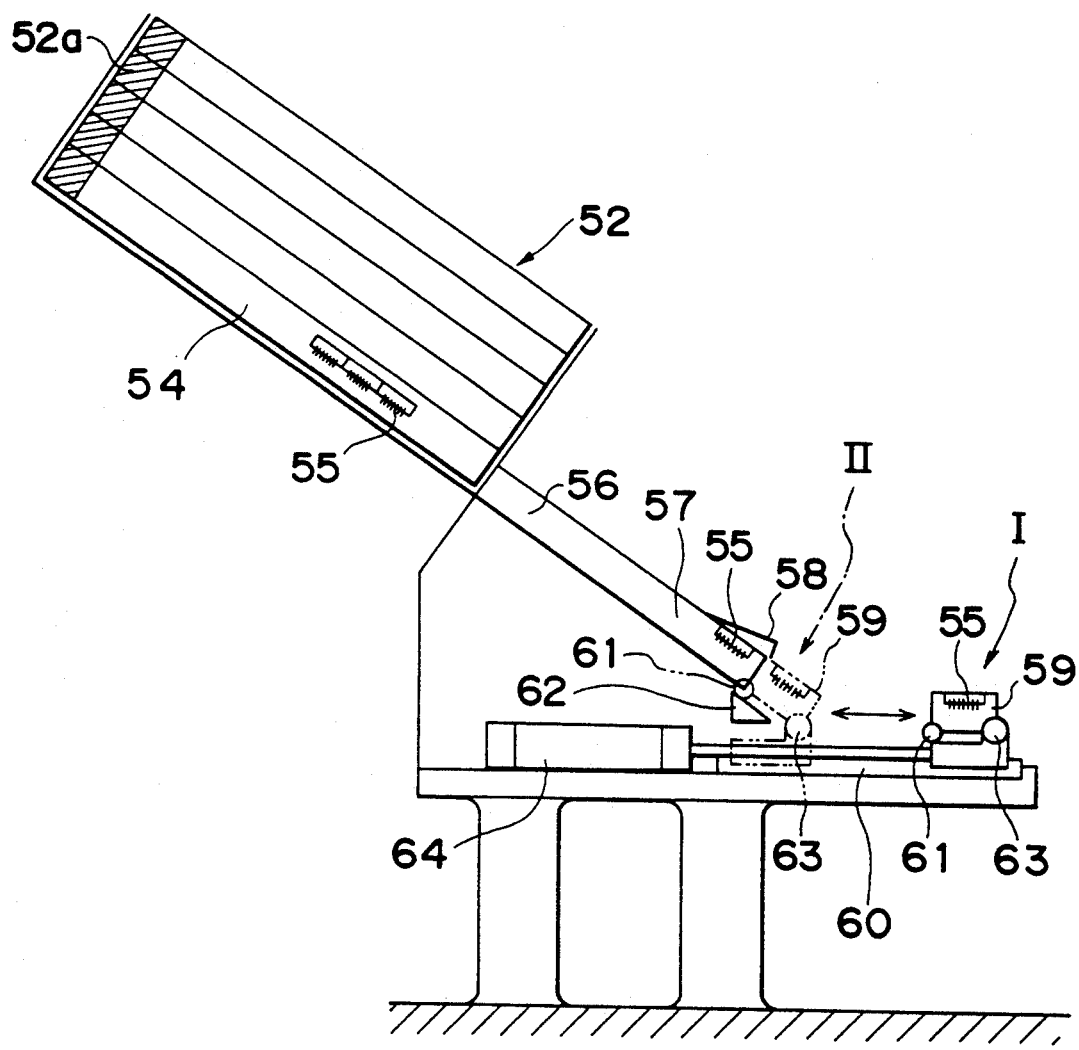

The parts cassette 4 according to the present invention may serve as a bulk-cassette type parts supply device 51 accommodating a plurality of parts in a container as shown in FIG. 10, a stick type parts supply device 52 holding parts slidably on a stick-shaped guide member as shown in FIG. 11, and a tray type parts supply device 53 accommodating parts arranged in line in a tray as shown in FIG. 12. The parts supply devices 51, 52, and 53 each includes recording sections 51a, 52a, and 53a provided with a storing portion for storing the number of parts and a processing/calculating section for rewriting the data of the parts number according to an operation for removing parts from each parts supply device.

FIG. 10 shows a front view of the bulk-cassette type parts supply device 51. A bulk cassette 67 accommodating electronic parts 66 is connected to an inclined shoot 65. A parts takeoff 70 is formed at one end of the inclined shoot 65. An air blowing device (not shown) for feeding air and a vacant portion (not shown) connecting the inside of the bulk cassette 67 with an air intake 68 formed at the lower end of the bulk cassette 67 are formed inside of a support stand 69 for supporting the bulk cassette 67. Only one of the electronic parts can pass through a space defined at the connecting portion between the bulk cassette 67 and the inclined shoot 65. Air supplied from the air blowing device is fed in the bulk cassette through the space and the air intake 68. The air is sprayed to the electronic parts so that one of the electronic parts is inserted into the space between the bulk cassette 67 and the inclined shoot 65. Since only one of the electronic parts can pass through the space, only one of the parts is fed to the inclined shoot 65 to reach the parts takeoff 70.

FIG. 11 shows a front view of the stick type parts supply device 52. Electronic parts 55 accommodated in a stick type chamber 54 are transported to a transfer portion 57 through an inclined shoot 56. A stopper 58 is arranged at the transfer portion 57 to prevent the parts from dropping off from the shoot 56. Reference numeral 59 denotes a holder capable of moving horizontally in FIG. 11 with a slide guide 60 and a driving device 64. The holder 59 moves to a position II shown by the dotted line in FIG. 11 while rollers 61 of the holder 59 moves on the incline surface of a triangle cam member 62 and the holder 59 rotates around a fulcrum 63 to align the holder 59 with the shoot 56. At the same time, the stopper 58 is opened to transport the lowest one of the parts 55 to the holder 59. Thereafter, the holder 59 moves to a position I shown by the solid line in FIG. 11 by the driving device 64 to supply one of the parts 55 to an electronic parts mounting machine. When the holder 59 starts to move from the position II to the position I, the stopper 58 is closed to prevent the parts 55 from dropping off from the shoot 56.

Figure 13:
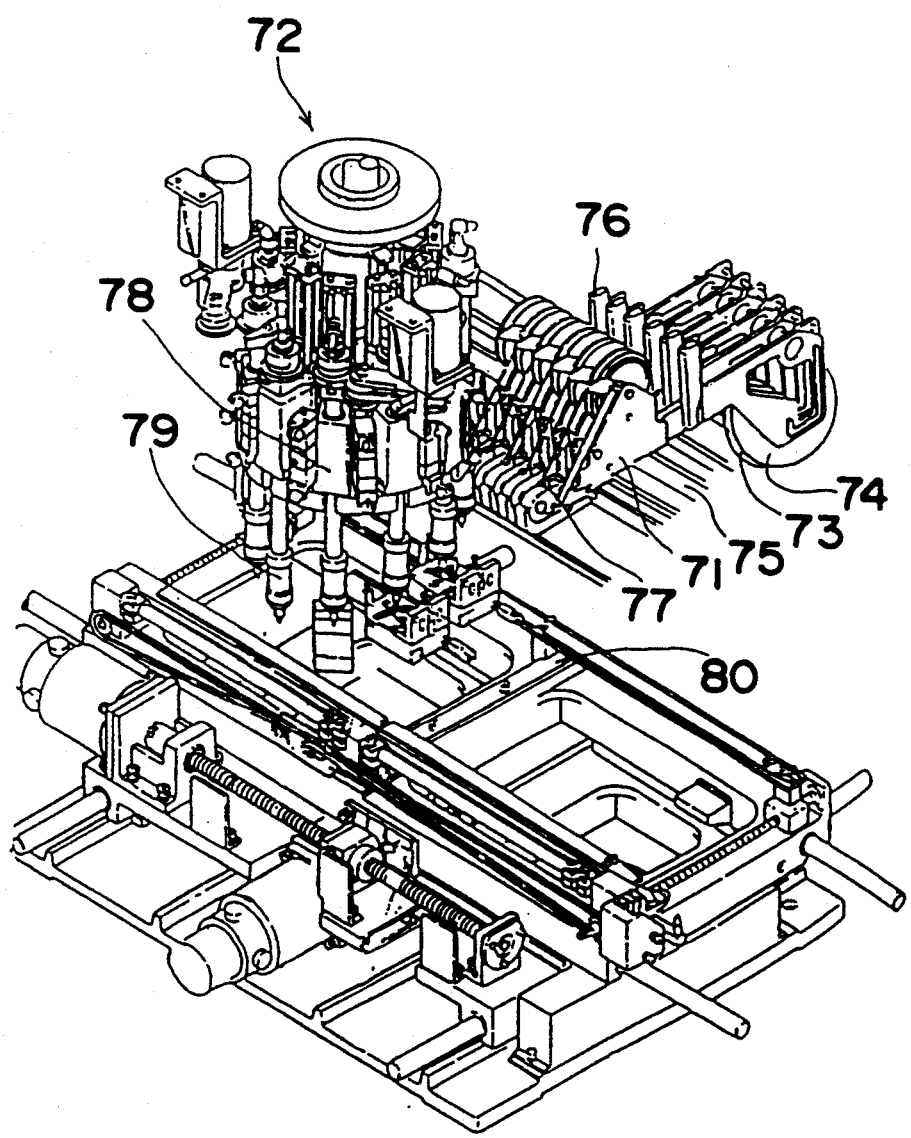
FIG. 13 shows a perspective view of an electronic parts mounting machine capable of using as one example in the embodiment.

FIG. 13 shows a perspective view of an electronic parts mounting machine capable of using as one example in the embodiment. Reference numeral 71 denotes a plurality of parts supply devices removably attached to an electronic parts mounting machine 72. An electronic parts-accommodating unit 73 is mounted on each of the parts supply devices 71 through a reel 74. The unit 73 is composed of electronic parts attached onto a carrier tape and covered with a cover tape, the tapes and the parts being wound around the reel 74. Each parts supply device 71 is positioned to a cassette holder 75 of the parts mounting device 72 by two positioning pins (not shown) and removed therefrom by a clamber 76. Reference numeral 77 denotes an electronic parts supply position where the parts sequentially fed by the unit 73 can be sucked through a nozzle 79 of a mounting head 78. Each of the parts accommodated in unit 73 is sucked at the parts supply position 77 by the nozzle 79 to sequentially hold one by one to mount one of the parts on a printed wiring board held on an X-Y table 80 during the mounting operation of the mounting head 78. In case of parts shortage or exchange of the kind of a printed wiring board, a part or all of the electronic parts supply devices are removed from the mounting machine 72 in accordance with the operation of the clamber 76.

In addition to the above embodiment, the following modifications of the present invention may be made. For example, the parts removal detecting means for outputting a parts removing signal is not limited to a means including a permanent magnet and instead any suitable means can be applied thereto. If there is no disadvantage of the mounting operation, a signal outputted from the control section 43 of the parts mounting machine 40 may be employed as the parts removal detecting means. In this case, the control section 43 has the function of the processing/calculating section 25 of the recording section 9. It is possible that a signal is not outputted each time each of the parts is removed from the parts cassette 4, but the data as to the number of parts which remain in the unit 2 may be written on the storing section 24 by a signal outputted from the control section 43 after a series of parts mounting operations terminates.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A parts supply device comprising:

a mounting means for mounting a unit accommodating a plurality of electronic parts on a parts mounting machine;

a parts feeding means for sequentially feeding the parts held by the unit to a predetermined removing position according to an operation of the parts mounting machine for removing the parts from the parts supply device;

a storing means for storing data as to the number of parts held by the unit; and a calculating means for rewriting the data as to the number of parts stored in the storing means according to the operation of the parts mounting machine for removing the parts from the parts supply device.

2. The parts supply device as claimed in claim 1, further comprising a removal detecting means for outputting a signal according to the operation of the parts mounting machine for removing the parts from the parts supply device, the signal being received by the calculating means to rewrite the data.

3. The parts supply device as claimed in claim 1, wherein the unit is composed of the parts attached onto a carrier tape and covered by a cover tape, the tapes and the parts being wound around a reel.

4. The parts supply device as claimed in claim 1, wherein the unit is composed of a stick type unit capable of sequentially taking out only one of the parts from the unit.

5. The parts supply device as claimed in claim 1, wherein the unit is composed of a bulk cassette type unit capable of sequentially taking out only one of the parts from the unit.

6. The parts supply device as claimed in claim 3, wherein the parts feeding means comprises a feeding section for sequentially moving the parts held by the unit to the parts removing position; a winding section for winding the cover tape of the unit; and a lever for driving the feeding section in synchronization with the operation of the parts mounting machine for removing the parts from the parts supply device.

7. The parts supply device as claimed in claim 6, further comprising a permanent magnet provided on an end of the lever, and a removal detecting means for outputting a signal upon detection of a magnetic force, the removal detecting means being provided in the vicinity of a moving locus of the permanent magnet, and the signal being received by the calculating means to rewrite the data.

8. The parts supply device as claimed in claim 1, further comprising a communicating means for transmitting data stored in the storing means to a communicating section of the parts mounting machine and a reading/writing means of a parts managing section and for receiving at least one of data and instruction therefrom.

9. A method for managing a number of parts in supplying the parts comprising the steps of:

reading an identifying mark provided on a unit accommodating a plurality of electronic parts and fetching data as to the number of parts of the unit from a data base in a storage area, based on data as to the kind of parts;

writing each piece of data obtained in the reading step in a storing means of a parts supply device on which the unit is mounted; and rewriting the data as to the number of parts written in the storing means according to an operation of a parts mounting machine for removing the parts from the parts supply device.

10. The method for managing a number of parts in supplying the parts as claimed in claim 9, wherein the identifying mark is composed of a bar code.

11. The method for managing a number of parts in supplying the parts as claimed in claim 9, further comprising a step of deciding whether or not the parts supply device has been set on the parts mounting machine at a predetermined position thereof.

12. The method of managing a number of parts in supplying the parts as claimed in claim 9, further comprising the steps of:

reading a current number of parts held by the unit;

calculating a period of time required for a certain kind of parts to be exhausted, based on a necessary number of parts to be used for an element on which one of the parts is mounted and a period of time required for mounting the parts thereon; and displaying a calculated result.

13. A system for managing a unit in supplying the unit to a parts mounting machine in which the unit, which accommodates a plurality of electronic parts, is mounted on a parts supply device, the system comprising the steps of:

reading an identifying mark provided on the unit and indicating an identification data of the parts;

reading out the identification data and data as to number of parts stored in a data base of a storage area;

deciding whether or not the identifying mark corresponds to the identification data and the data as to the number of parts;

storing the data as to the number of parts in a storing means provided in the parts supply device according to a decision that the identifying mark corresponds to the identification data of the parts;

reading a current number of the parts held by the unit in the data base in removing the unit from the parts supply device; and storing the current number in the data base.

14. The system as claimed in claim 13, further comprising the steps of:

secondarily reading the identifying mark in removing the unit from the parts supply device; and deciding whether or not the identifying mark secondarily read corresponds to the identification data of the parts, so that when it is decided that the identifying mark secondarily read corresponds to the identification data of the parts, the current number storing step is carried out.

15. The system as claimed in claim 13, further comprising the steps of:

secondarily reading out the identification data of the parts held by the unit in removing the unit from the parts supply device; and storing the identification data of the parts in the data base which is secondarily read.

16. The system as claimed in claim 13, further comprising a step of combining a plurality of the same kind of units in which the number of parts has been reduced to a value which is less than a predetermined number.

17. The system as claimed in claim 13, wherein the data as to the kind and number of parts is recorded on the identifying mark.

18. The system as claimed in claim 16, wherein the combining step, when a plurality of units are combined, data as to the number of parts held by a plurality of units stored in the data base are added to each other to store data obtained by addition in the data base.

19. The system as claimed in claim 13, wherein the unit is composed of the parts attached onto a carrier tape and covered with a cover tape, the tapes and the parts being wound around a reel.

20. The system as claimed in claim 13, wherein the unit is composed of a stick type unit capable of sequentially taking out only one of the parts from the unit.

21. The system as claimed in claim 13, wherein the unit is composed of a bulk cassette type unit capable of sequentially taking out only one of the parts from the unit.

22. The system as claimed in claim 13, further comprising a step of reading data and an instruction displayed with bar codes by a bar code reader to input the data and the instruction.

23. An apparatus for managing a unit in supplying the unit to a parts mounting machine in which the unit, which accommodates a plurality of electronic parts, is mounted on a parts supply device, the apparatus comprising:
   a first reading means for reading an identifying mark provided on the unit and indicating an identification data of the parts;
   a read-out means for reading out the identification data and data as to the number of parts stored in a data base of a storage area;
   a first decision means for deciding whether or not the identifying mark corresponds to the identification data of the parts;
   a first storage means for storing the data as to the number of parts, provided in the parts supply device according to a decision that the identifying mark corresponds to the identification data of the parts;
   a second reading means for reading a current number of the parts held by the unit in the data base in removing the unit from the parts supply device; and
   a second storage means for storing the current number in the data base.

24. The apparatus as claimed in claim 23, wherein in removing the unit from the parts supply device, the first reading means secondarily reads the identifying mark, the apparatus further comprising a second decision means for deciding whether or not the identifying mark secondarily read corresponds to the identification data of the parts, so that when it is decided that the identifying mark secondarily read corresponds to the identification data of the parts, the second storage means stores the identification data and the current number of parts.

25. The apparatus as claimed in claim 23, wherein the removing the unit from the parts supply device, wherein the read-out means secondarily reads the identification data of the parts held by the unit in removing the unit from the parts supply device, and the second storage means stores the identification data of the parts in the data base which is secondarily read.

26. The apparatus as claimed in claim 23, further comprising a combining means for combining a plurality of the same kind of units in which the number of parts has been reduced to a value which is less than a predetermined number.

27. The apparatus as claimed in claim 23, wherein the data as to the kind and number of parts is recorded on the identifying mark.

28. The apparatus as claimed in claim 26, wherein when the combining means combines a plurality of units, data as to the numbers of the parts held by a plurality of units stored in the data base are added to each other to store data obtained by addition in the data base.

29. The apparatus as claimed in claim 23, wherein the unit is composed of the parts attached onto a carrier tape and covered with a cover tape, the tapes and the parts being wound around a reel.

30. The apparatus as claimed in claim 23, wherein the unit is composed of a stick type unit capable of sequentially taking out only one of the parts from the unit.

31. The apparatus as claimed in claim 23, wherein the unit is composed of a bulk cassette type unit capable of sequentially taking out only one of the parts from the unit.

32. The apparatus as claimed in claim 23, further comprising a means for inputting data and an instruction, and having a bar code reader and bar codes which display the data and the instruction respectively.

* * * * *